United States Patent [19]

Lin et al.

[11] Patent Number: 5,128,833
[45] Date of Patent: Jul. 7, 1992

[54] SELF-LOCKING SYSTEM FOR CIRCUIT BOARD HOLDING FRAMES

[75] Inventors: Shang C. Lin; Kuochin E. Su, both of Raleigh, N.C.

[73] Assignee: Alcatel Network Systems, Inc., Richardson, Tex.

[21] Appl. No.: 675,414

[22] Filed: Mar. 26, 1991

[51] Int. Cl.⁵ .............................. H02B 1/02
[52] U.S. Cl. .................. 361/415; 361/391; 361/395; 439/327; 211/41
[58] Field of Search .............. 361/391, 395, 412, 413, 361/415; 439/325, 327, 368, 61, 64; 211/41

[56] References Cited

U.S. PATENT DOCUMENTS

| | | | |
|---|---|---|---|
| 3,644,868 | 2/1972 | Nevala | 361/415 |
| 3,926,490 | 12/1975 | Bertellotti | 361/415 X |
| 4,051,549 | 9/1977 | Fiege | 211/41 X |
| 4,418,820 | 12/1983 | Nagle et al. | 211/41 X |
| 4,620,756 | 11/1986 | Gatti et al. | 439/325 X |
| 4,964,810 | 10/1990 | Malotke et al. | 361/415 X |

Primary Examiner—Leo P. Picard
Assistant Examiner—Paramita Ghosh
Attorney, Agent, or Firm—Ware, Fressola, Van Der Sluys & Adolphson

[57] ABSTRACT

A self-locking system for use with circuit board holding frames comprises two side panels each having a specially configured slot for guiding a retainer bar, which extends between the two slots, between a locked and a loading position. Each slot has a shape similar to that of an upside down "L" and is positioned on each side panel at the top corner adjacent to the holding frame opening. In the locked position, the retainer bar, which is held in the guide slots by shoulder screws at each end, extends across the frame opening thereby blocking any outward board movement. In the loading position, the retainer bar rests out of the opening thus providing clearance for board removal or installation. A lip, which prevents the retainer bar from inadvertently toppling down into the locked position, is dimensioned so that the retainer bar may fall down into the locked position upon sufficient mechanical vibration if the system is mistakenly left unlocked.

25 Claims, 2 Drawing Sheets

SELF-LOCKING SYSTEM FOR CIRCUIT BOARD HOLDING FRAMES

BACKGROUND OF THE INVENTION

1. Field of the Invention

The present invention relates to locking systems for circuit board holding frames and more particularly to a self-locking system for securing circuit boards in a circuit board holding frame thereby preventing the boards from becoming inadvertently disconnected from the frame's electrical system.

2. Description of the Prior Art

It is conventional for circuit boards to be held in a circuit board holding frame so that the circuit board connectors remain in mating contact with mating frame connectors mounted on the back portion of the frame. In order to obtain the necessary spacing from board to board, guide elements, in which the boards are slideably inserted, are provided and secured to the frame. The guide elements provide the necessary alignment to insure that the board contacts make a solid connection with the contacts in the mating frame connectors. It is essential for proper circuit operation that the board contacts and the mating frame connector contacts remain solidly connected.

Problems can occur when seismic motion or vibration caused by transit or local traffic causes the circuit boards to "walk out" of the circuit board holding frame. This occurs even though a substantial amount of force is usually necessary for disengagement of the board and mating connectors. As a result, the contacts of the circuit boards completely lose the connection with the mating frame connector contacts. In the alternative, the board contacts may retain a connection which is not solid but intermittent and, therefore, not dependable. This naturally causes problems for consistent system behavior.

This "walk out" problem has been solved, in some instances, by utilizing retaining mechanisms on each board. For example, screws may be used for securing each board to the circuit board holding frame. This method, however, is rather tedious and time-consuming, especially when the insertion or removal of circuit boards is somewhat frequent.

Other systems have been designed to solve the "walk out" problem while making it easier for the user to install and remove circuit boards. One such system utilizes a retaining bar extending from one side of the circuit board holding frame to the other across its opening. The retaining bar, which is pivotally mounted at each end to the frame, may be rotated from a "locked" position to a "loading" position by moving it upwardly and backwardly. In the locked position, the retaining bar blocks the frame opening and prevents the circuit boards from moving outwardly from their mating frame connectors. Thus, the retaining bar insures a solid connection at all times. A spring retainer is utilized on one side of the frame to hold the retainer bar in its locked position.

In the loading position, the retainer bar is positioned out of the way of the circuit boards so that they may be removed or installed in the frame. To move the bar from the locked to the loading position, one hand is used to push the spring retainer outward while the other hand is used to push the retainer bar up and backward into the loading position. This provides clearance for the removal or installation of the circuit boards. To lock the system, one hand is used to push the spring retainer sufficiently outward to allow the retainer bar to return to its locked position while the other hand is used to pull the retainer bar forward and downward. The spring retainer is then released in order to secure the retainer bar in the locked position.

With this system configuration, however, the spring retainer provides a positive locking force only on the portion of the retainer bar adjacent to the spring retainer. At the opposite end of the retainer bar, there is naturally less locking force exerted by the spring retainer and the retainer bar may move to a limited extent if a force is exerted on it. Thus, even by using this system, the circuit boards furthest from the spring retainer can "walk out" of their mating frame connectors and become disconnected from the system because the retaining force exerted is insufficient to counter a force exerted by a "walking" circuit board. This is especially true for wider circuit board holding frames and heavier circuit boards.

While it is possible to equip the above-described system with a spring retainer on each side of the frame in order to achieve sufficient retaining force on all of the circuit boards in the frame, the use of two spring retainers would require two hands to unlatch the device and would create a handling problem for the user. In addition, such a system requires many different parts thereby complicating the manufacture and assembly.

Furthermore, in both the single and double spring retainer systems, the retainer bar intrudes into space in front of and above the circuit board holding frame when it is in the loading position. This space is normally allocated to another circuit board holding frame or electronic device and may or may not be available for such use.

Finally, this type of system does not have a "fail-safe" feature. More specifically, in order to lock the circuit boards in place, the user must bring the retainer bar back to its locked position. This requires a positive action by the user encompassing the pushing of the spring retainer sufficiently outward so that the bar may be moved from the loading to the locked position. If the user forgets to lock the retainer bar, the retainer bar will remain in the loading position, thereby providing no positive locking on any of the circuit boards, thus losing its functionality.

SUMMARY OF THE INVENTION

The present invention is designed to overcome the limitations that are attendant upon the use of traditional circuit board locking systems for use with circuit board holding frames. The novel self-locking system of the present invention provides a uniform, positive retaining force on a retainer bar which blocks any outward movement of the circuit boards in the frame. It is self-contained so as to not intrude upon space beyond its own allocated domain and allows for operation with only one hand. Finally, it provides a "fail-safe" feature whereby the retainer bar will move from the "loading" position to the "locked" position upon any mechanical disturbance if the user forgets to lock the system.

The present invention comprises a circuit board holding frame having two side panels each having a specially configured slot. The side panel slots act to guide a retainer bar which extends across the opening of the circuit board holding frame. Each slot has a shape similar to that of an upside down "L" and is positioned on each side panel at the top corner adjacent to the frame opening.

The retainer bar, which is sufficiently rigid to prohibit any outward board movement caused by vibrations, has threads tapped on both ends to accommodate shoulder screws. Each shoulder screw has a neck portion which slides within each slot of the side panels and is utilized to keep the bar within the guide slots.

When the self-locking system is assembled, the retainer bar can be placed in one of two operating positions: a "loading" position, where the retainer bar rests on top portions of the slots out of the frame opening; and a "locked" position, where the retainer bar rests on the bottoms of the slots across a portion of the frame opening. In order to install or remove a circuit board from the circuit board holding frame, the retainer bar must be moved to the "loading" position. This is accomplished by sliding the retainer bar upwardly along the slot and laterally along the top of the slot where it can be rested out of the frame opening and, thus, out of the way of the circuit boards. This may be done with one hand thus allowing the user use of the other hand. In the loading position, the bar provides clearance for the installation or removal of boards but does not intrude into space above or in front of the circuit board holding frame, thus remaining self-contained within the frame structure.

On completion of the circuit board removal or installation, the retainer bar may simply be dropped to the "locked" position Again, the user needs only one hand. In the locked position, the retainer bar prohibits outward movement of any of the circuit boards in the frame which begin to become dislodged as a result of vibrations. Thus, solid connection between the board and corresponding frame contacts for all of the boards can be maintained even if the system is subjected to severe mechanical disturbances.

The top portion of each slot is designed with a slight lip so that the retainer bar may rest in the loading position without inadvertently falling down into the locked position when a user is installing or removing a board. Further, the lip is modest enough in size so that if the retainer bar is left in the loading position by mistake, it will, upon sufficient mechanical disturbance, drop into the locked position. Thus, the boards are locked in place by the retainer bar before they can be dislodged from solid contact with the mating frame connectors. This comprises a fail-safe feature where the system will self-lock if the system is inadvertently left unlocked.

A primary object of the present invention is to provide a circuit board self-locking system for use with a circuit board holding frame which provides uniform, positive locking for each of the circuit boards in the frame.

Another object of the present invention is to provide a circuit board locking system which may be operated with one hand.

Another object of the present invention is to provide a circuit board self-locking system which is self-contained and does not intrude upon space beyond its allocated domain.

Another object of the present invention is to provide a circuit board self-locking system having a fail-safe feature wherein the system will lock itself before any of the circuit boards can "walk out" in the case where the system is inadvertently left unlocked.

Another object of the present invention is to provide a circuit board self-locking system which requires fewer components and has a simpler construction.

The above and other objectives and advantages of the invention will become more apparent upon reading the description of the invention in connection with the drawings described below.

DESCRIPTION OF THE PREFERRED EMBODIMENT

Figure 1:
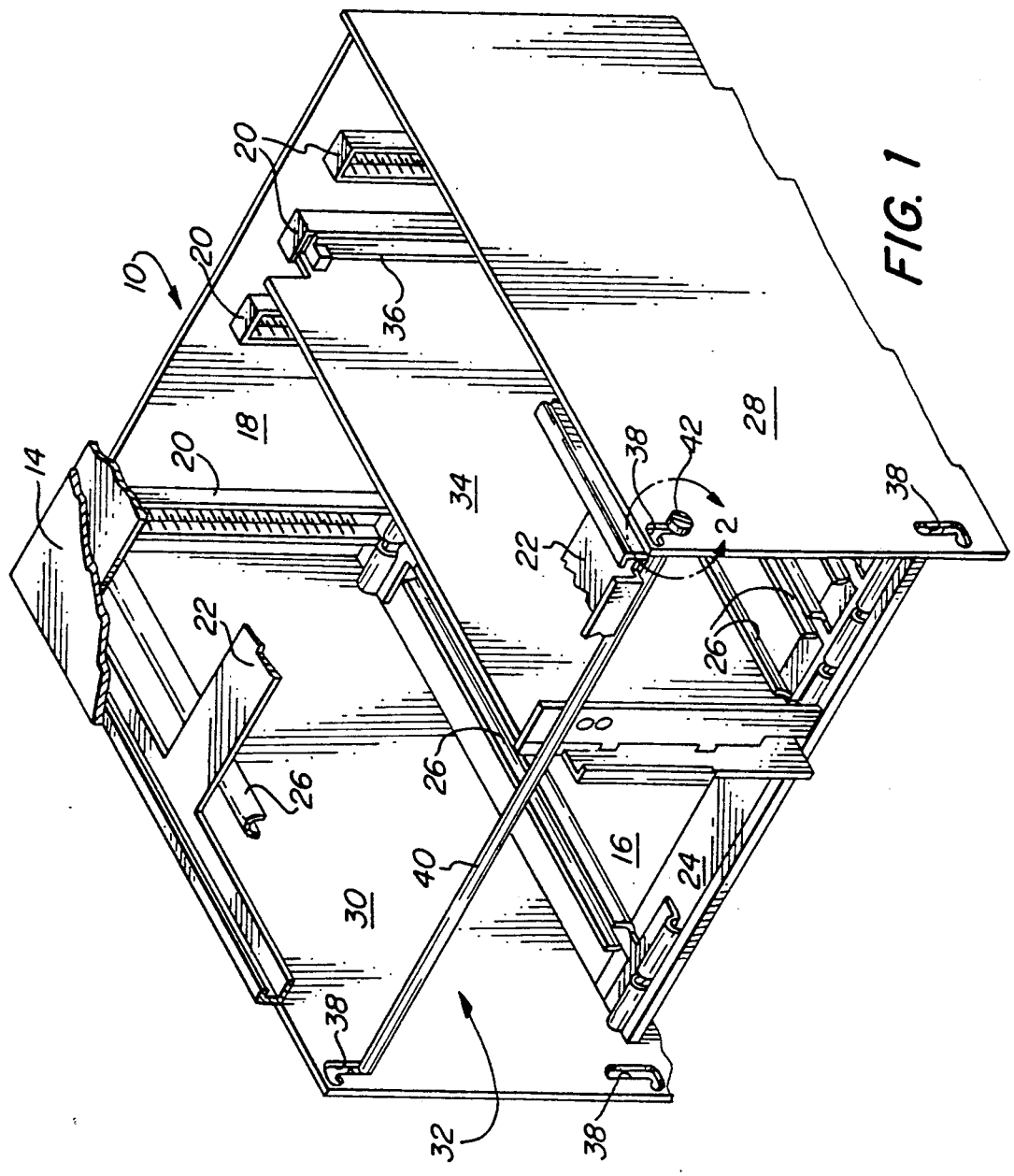
FIG. 1 is a perspective view of the circuit board self-locking system of the present invention.

FIG. 1 illustrates a circuit board holding frame 10 utilizing the self-locking system of the present invention. The circuit board holding frame 10 comprises a top and a bottom panel 14, 16, only a portion of top panel 14 being shown. Holding frame 10 further comprises a back panel 18 having frame connectors 20 mounted thereto and top and bottom frame structures 22, 24 having guide elements 26 mounted thereto. Top and bottom panels 14, 16 are mounted to frame structures 22, 24.

Holding frame 10 further comprises first and second side panels 28, 30 which are mounted to top and bottom frame structures 22, 24. Panels 28, 30 are positioned substantially parallel with one another and perpendicular to the remaining panels 14, 16, 18, thereby forming the substantially rectangular shaped holding frame 10.

Holding frame 10 has an opening 32 through which circuit boards 34 may be inserted or removed from holding frame 10. Although a plurality of circuit boards are normally held in holding frame 10, for clarity, a single circuit board 34 inserted in the holding frame 10 is shown in FIG. 1. The circuit boards, which have electronics mounted thereon for a particular electronic function, each have a board connector 36 which is inserted in a mating frame connector 20 mounted on back panel 18. In order to obtain necessary spacing from board to board, guide elements 26, which are secured to top and bottom frame portions 22, 24 are provided. The guide elements 26, in which the boards are slideably inserted, provide the necessary alignment to insure that the board contacts of the board connector 36 make a solid connection with the contacts in the corresponding mating frame connector 20. It is essential for proper circuit function that the board contacts and the mating frame connector contacts remain solidly connected.

Side panels 28, 30 each have a guide slot 38 positioned at the top corner adjacent to the frame opening 32. Guide slots 38, which have a shape similar to that of an upside down "L", are utilized for guiding a retainer bar 40 between two resting positions. Retainer bar 40 extends between the two guide slots 38 across the opening of the circuit board holding frame.

Retainer bar 40 is sufficiently rigid to prohibit any outward board movement caused by vibrations. Bar 40 has threads tapped on both ends to accommodate shoulder screws 42. Each shoulder screw 42 has a neck portion 46 which slides within each guide slot 38 and is utilized to keep retainer bar 40 within guide slots 38 (see FIG. 2).

Figure 3:
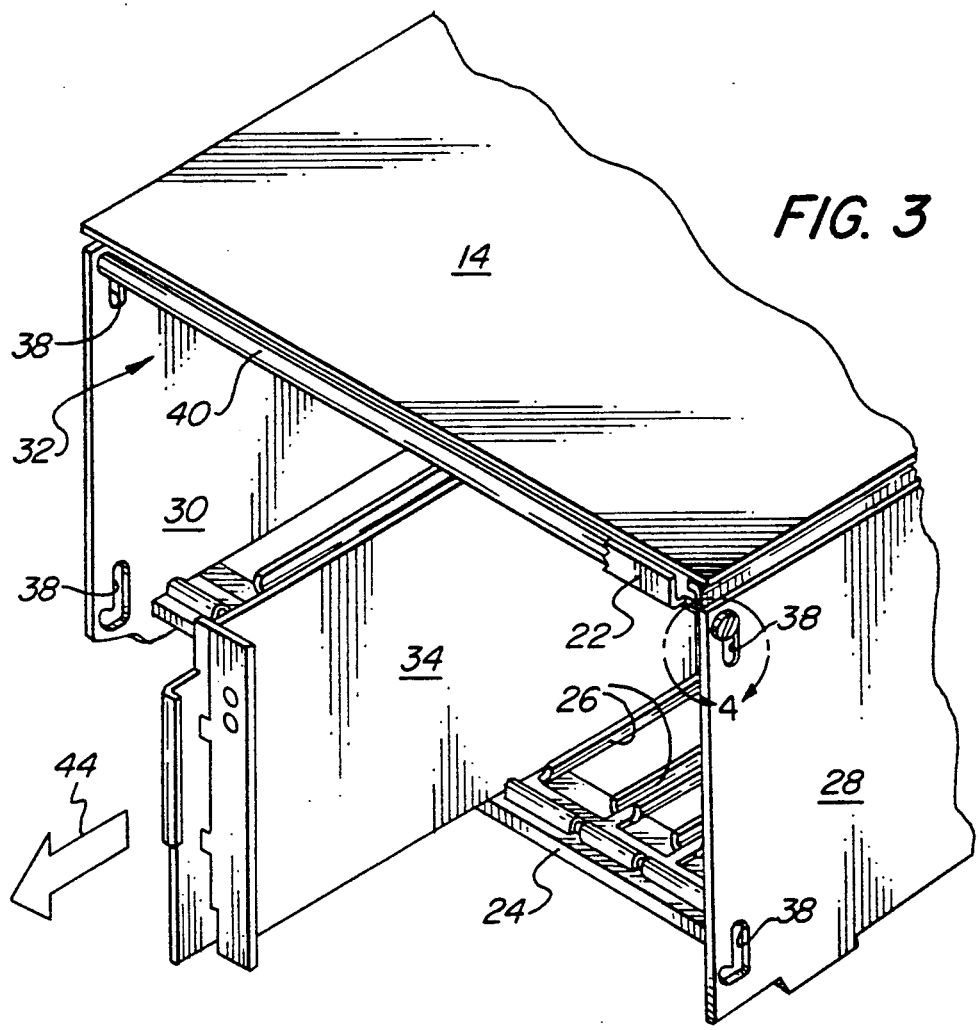
FIG. 3 is a perspective view of the circuit board self-locking system of the present invention showing a circuit board partially removed.
Figure 4:
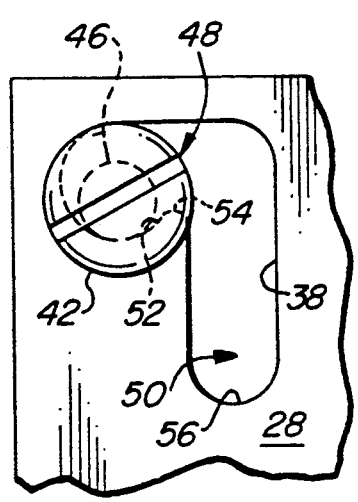
FIG. 4 is a partial, side elevational view of the self-locking system as indicated by circle 4 of FIG. 3.

FIG. 4 illustrates an enlarged, side elevational view of a portion of the system as indicated by circle 4 in FIG. 3. Guide slot 38 comprises a loading portion 48 extending laterally along the top of guide slot 38 and a locking portion 50 extending vertically downwardly from one edge of the loading portion 48.

Loading portion 48, which extends laterally towards frame opening 32 with respect to locking portion 50, has an arcuate depression 52 dimensioned to receive neck 46 of shoulder screw 42. A slight lip 54 separates lateral loading portion 48 and vertical locking portion 50 and acts to retain neck 46 in depression 52.

Locking portion 50 extends vertically downwardly from lip 54 to stop 56 which is also arcuate in shape and dimensioned to receive neck 46.

Figure 2:
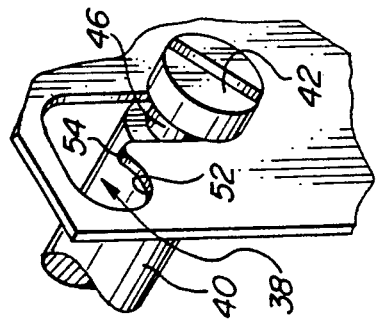
FIG. 2 is an enlarged view of the area indicated by circle 2 in FIG. 1.

When holding frame 10 is assembled, retainer bar 40 can be located in one of two operating positions: a "loading" position, where retainer bar 40 rests in loading portion 48 of guide slots 38 (see FIGS. 3 and 4); and a "locked" position where retainer bar 40 rests in locking portion 50 of guide slots 38 (see FIGS. 1 and 2). When retainer bar 40 is in the locked position, retainer bar 40 rests on stops 56 at the bottom of locking portions 50. Stops 56 are positioned sufficiently downwardly in side panels 28, 30 so that retainer bar 40 will block the removal of circuit board 34 from its connection with mating frame connector 20 (see FIG. 1). Thus, retainer bar 40 locks circuit board 34 in its connected position and prevents any outward board movement towards holding frame opening 32. Retainer bar 40 in the locked position prevents "walk out" even if the circuit board holding frame is subjected to severe mechanical disturbances. Because retainer bar 40 is restrained from outward movement on both of its ends by guide slots 38, it is able to provide uniform, positive locking for any additional circuit boards utilized in circuit board holding frame 10.

In the loading position, retainer bar 40 rests in depressions 52 (see FIGS. 3 and 4). Depressions 52 are positioned sufficiently upwardly in side panels 28, 30 so that retainer bar 40 will provide clearance for the removal of circuit board 34 from holding frame 10 when in the loading position. Lip 54 retains bar 40 in the loading position during the removal of board 34 as indicated by arrow 44 (see FIG. 3). In this configuration, the system is "unlocked".

In order to move retainer bar 40 from the locked to the loading position, retainer bar 40 is slid upwardly from locking portions 50 and laterally along the loading portions 48. It is then rested in depressions 52 out of the way of the circuit boards. This may be accomplished by the user using one hand thus allowing the remaining hand to be free for other uses. In the loading position, the retainer bar 40 provides clearance for the boards but does not intrude into space above the circuit board holding frame or in front of an adjacent frame, but rather remains self-contained within the frame structure.

On completion of the circuit board removal or installation, retainer bar 40 may simply be dropped from loading portions 48 to locking portions 50 to the locked position. Again, the user needs only one hand for this operation.

If, however, the user forgets to move retainer bar 40 to the locked position upon completion of the removal or installation of circuit boards, lips 54 of loading portions 48 are dimensioned such that retainer bar 40 will topple over lips 54 and down into locking portions 50 into the locked position upon sufficient mechanical disturbance, such as upon vibration caused by transit. Thus, before the connected circuit boards may become disconnected from mating frame connectors due to system vibration, retainer bar 40 will "self-lock" as a greater vibratory force is required for board disconnection than for the system self-lock thereby making the system fail-safe. The system is, therefore, designed so that the vibratory force necessary to cause system self-lock is less than the vibratory force required for disengagement of the board from its mating connector.

Figure 5:
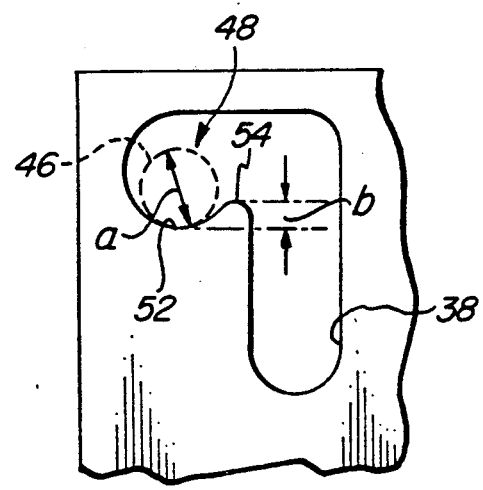
FIG. 5 is a side elevational view of a guide slot utilized in the present invention.

FIG. 5 illustrates a guide slot utilized in the present invention showing the dimensions for optimum self-locking performance. Neck portion 46 (in dashed lines) of shoulder screw 42 is shown having a diameter of "a". Lip 54 of loading portion 48 has a height "b" measured from its peak to the bottom of depression 52. In the preferred embodiment, diameter "a" has a value of 0.125 inches and height "b" has a value of 0.040 inches. These values may be varied slightly and the system will still remain functional. Diameter "a", however, is directly proportional to height "b" and, thus, any increase in diameter "a" must have a corresponding increase in height "b" thus maintaining a ratio "r" (a/b) of approximately 3 to 1, or in this case, 3.125 to 1.

As can be seen in FIGS. 1 and 3, side panels 28, 30 each have two guide slots 38, one being positioned at an upper corner adjacent to opening 32 and the other being positioned directly beneath at a lower corner adjacent to opening 32. The bottom guide slot is the mirror-image of the upper guide slot. This allows side panels 28, 30 to be interchangeable with each other during assembly.

Thus, it can be seen from the foregoing specification and attached drawings that the self-locking system for circuit board holding frames provides an effective means for locking circuit boards in a holding frame. It requires a reduced number of parts (two shoulder screws and one retainer bar) when compared to other locking systems. The system may be locked or unlocked using only one hand thus allowing the remaining hand to be free for other uses. The system provides uniform, positive locking for all of the circuit boards in the frame and is self-contained within the frame structure thereby not intruding into non-allocated space. Finally, the system will self-lock if it is inadvertently left unlocked.

What is claimed is:

1. A self-locking system for use with a circuit board holding frame for holding circuit boards having board connectors in mating contact with frame connectors mounted on said holding frame, said holding frame having an opening for the removal or insertion of said circuit boards in said holding frame, said system comprising:

a first and a second side panel, each having an edge adjacent to said opening and a guide slot adjacent to said edge; and a retainer bar extending between said side panels and supported for movement in said guide slots between a first locked position wherein said retainer bar is positioned across at least a portion of said opening and a second loading position wherein said retainer bar is positioned out of said opening.

2. The self-locking system defined in claim 1, wherein each guide slot comprises a locking portion and a loading portion, said retainer bar being positioned in said locking portions when in said first locked position and being positioned in said loading portions when in said second loading position.

3. The self-locking system defined in claim 2, wherein said loading portion extends laterally along an upper portion of said side panel and said locking portion extends vertically downwardly from said loading portion.

4. The self-locking system defined in claim 3, wherein said loading portion comprises a depression for said retainer bar to rest when in said loading position.

5. The self-locking system defined in claim 3, wherein said locking portion comprises a stop for said retainer bar to rest when in said locked position.

6. The self-locking system defined in claim 3, wherein each guide slot further comprises a lip between said loading portion and said locking portion.

7. The self-locking system defined in claim 6, wherein said lip is dimensioned so that said retainer bar is able to move from said loading position to said locked position upon sufficient system vibration.

8. The self-locking system defined in claim 7, wherein said retainer bar has a diameter (a) and said lip has a height (b) being measured from the top of said lip to the bottom of said depression, the ratio (a/b) of the retainer bar diameter (a) to the lip height (b) is equal to approximately 3 to 1.

9. The self-locking system defined in claim 8, wherein the ratio (a/b) is equal to 3.125 to 1.

10. The self-locking system defined in claim 9, wherein the retainer bar diameter is equal to 0.125 inches and the lip height is equal to 0.040 inches.

11. The self-locking system defined in claim 1, wherein said system further comprises first and second shoulder screws for supporting said retainer bar in said guide slots, and further wherein said retainer bar has first and second ends threaded for receipt of said first and second shoulder screws.

12. The self-locking system defined in claim 1, wherein each side panel has more than one guide slot, at least one of said guide slots being positioned at an upper corner adjacent to said opening and at least one of said guide slots being positioned at a lower corner adjacent to said opening whereby each side panel will function properly in either of two assembled positions.

13. A self-locking circuit board holding frame for holding circuit boards having board connectors, said holding frame comprising:
- a frame structure having an opening through which said circuit boards may be installed or removed;
- a plurality of frame connectors mounted on a back portion of said frame structure, said frame connectors being dimensioned for mating receipt of said board connectors;
- first and second side panels each having an edge adjacent to said opening and a guide slot adjacent to said edge; and
- a retainer bar extending between said panels and supported for movement in said guide slots between a first locked position wherein said retainer bar is positioned across at least a portion of said opening and a second loading position wherein said retainer bar is positioned out of said opening.

14. The self-locking circuit board holding frame defined in claim 13, wherein each guide slot comprises a locking portion and a loading portion, said retainer bar being positioned in said locking portions when in said locked position and being positioned in said loading portions when in said second loading position.

15. The self-locking circuit board holding frame defined in claim 14, wherein said loading portion extends laterally along an upper portion of said side panel and said locking portion extends vertically downwardly from said loading portion.

16. The self-locking circuit board holding frame defined in claim 15, wherein said loading portion comprises a depression for said retainer bar to rest when in said loading position.

17. The self-locking circuit board holding frame defined in claim 15, wherein said locking portion comprises a stop for said retainer bar to rest when in said locked position.

18. The self-locking circuit board holding frame defined in claim 15, wherein each guide slot further comprises a lip between said loading portion and said locking portion.

19. The self-locking circuit board holding frame defined in claim 18, wherein said lip is dimensioned so that said retainer bar is able to move from said loading position to said locked position upon any system vibration.

20. The self-locking circuit board holding frame defined in claim 19, wherein said retainer bar has a diameter (a) and said lip has a height (b), the height (b) being measured from the top of said lip to the bottom of said depression, the ration (a/b) of the retainer bar diameter (a) to the lip height (b) is equal to approximately 3 to 1.

21. The self-locking circuit board holding frame defined in claim 20, wherein the ration (a/b) is equal to 3.125 to 1.

22. The self-locking circuit board holding frame defined in claim 21, wherein the retainer bar diameter is equal to 0.125 inches and the lip height is equal to 0.040 inches.

23. The self-locking circuit board holding frame defined in claim 13, wherein said system further comprises first and second shoulder screws for supporting said retainer bar in said guide slots, and further wherein said retainer bar has first and second ends threaded for receipt of said first and second shoulder screws.

24. The self-locking circuit board holding frame defined in claim 13, wherein each side panel has more than one guide slot, at least one of said guide slots being positioned at an upper corner adjacent to said opening and at least one of said guide slots being positioned at a lower corner adjacent to said opening whereby each of said side panels will function properly in either of two assembled positions.

25. A self-locking circuit board holding frame having frame connectors for holding circuit boards having board connectors in mating contact with said frame connectors, said board connectors adapted for disengaging said frame connectors when subjected to a first vibratory force, said holding frame comprising:
- locking means, supported for movement between a loading position wherein said board connectors are allowed to disengage said frame connectors and a locked position wherein said board connectors are prevented from disengaging said frame connectors, for selectively preventing said board connectors from disengaging said frame connectors; and
- mounting means for mounting said locking means so that said locking means moves from said loading position to said locked position when subjected to a second vibratory force less than said first vibratory force.

* * * * *

UNITED STATES PATENT AND TRADEMARK OFFICE
CERTIFICATE OF CORRECTION

PATENT NO. : 5,128,833
DATED : July 7, 1992
INVENTOR(S) : Shang C. Lin; Kuochin E. Su It is certified that error appears in the above-identified patent and that said Letters Patent is hereby corrected as shown below:

Column 8, line 28; "ration" should be --ratio--;

Column 8, line 31; "ration" should be --ratio--.

Signed and Sealed this

Tenth Day of August, 1993

Attest:

MICHAEL K. KIRK

*Attesting Officer*   *Acting Commissioner of Patents and Trademarks*